United States Patent
Xie

(10) Patent No.: US 8,258,808 B2
(45) Date of Patent: Sep. 4, 2012

(54) SYSTEM FOR TESTING POWER SUPPLY PERFORMANCE

(75) Inventor: Ling-Yu Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 285 days.

(21) Appl. No.: 12/840,197

(22) Filed: Jul. 20, 2010

(65) Prior Publication Data
US 2011/0187403 A1    Aug. 4, 2011

(30) Foreign Application Priority Data
Feb. 1, 2010    (CN) ...................... 2010 2 0302008 U

(51) Int. Cl.
*G01R 31/40* (2006.01)
(52) U.S. Cl. .................................. 324/764.01
(58) Field of Classification Search ........................ None
See application file for complete search history.

(56) References Cited

U.S. PATENT DOCUMENTS

| | | | | |
|---|---|---|---|---|
| 4,037,156 A | * | 7/1977 | Goujon et al. | 324/764.01 |
| 6,339,340 B1 | * | 1/2002 | Hsu | 324/764.01 |
| 7,930,579 B2 | * | 4/2011 | Yuan et al. | 713/340 |

* cited by examiner

*Primary Examiner* — Vinh Nguyen
(74) *Attorney, Agent, or Firm* — Altis Law Group, Inc.

(57) ABSTRACT

A system for testing DC power supply performance includes a control circuit electrically connected to the DC power supply, a test device, and a control device electrically connected to the test device. The control circuit includes a micro controller capable of outputting control signals, a switch control module, and a switch module. The switch control module receives the control signals and powers up according to the control signals. The switch module is electrically connected to the DC power supply input and output terminals respectively, under control of the switch control module. The test device is electrically connected to the switch module and is electrically connected with the DC power supply input and output terminals according to the control signals. The test device reads voltages at the DC power supply input and output terminals which are transmitted to the control device.

14 Claims, 2 Drawing Sheets

SYSTEM FOR TESTING POWER SUPPLY PERFORMANCE

BACKGROUND

1. Technical Field

The present disclosure relates to testing systems, and particularly to a system for testing power supply performance.

2. Description of Related Art

Many electronic apparatuses are not equipped with internal power supply devices in order to save space and costs. Therefore, these electronic apparatuses require external power supplies. Computers are powered by power supplies, which are capable of converting alternating current into direct current. Testing power supply conversion efficiency is an important test for determining reliability of the power supply. A power supply outputs +12V, +12VCPU (a power rail for CPU), +5V, +3.3V, −12V, and +5Vaux (standby voltage of +5V) DC voltages at corresponding voltage output terminals. An output power of each of the voltage output terminals is calculated by the formula: P=UI. A total output power of the power supply equals the sum of all the output power of the voltage output terminals. Then, the ratio of the total output power of the power supply to AC input power can be calculated to determine whether the power supply achieves standard conversion efficiency. However, a typical testing system needs an operator to manually operate a plurality of switches and record current and voltage of each of the voltage output terminals, which is inefficient.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

In general, the word "module," as used herein, refers to logic embodied in hardware or firmware, or to a collection of software instructions, written in a programming language, such as, for example, Java, C, or Assembly. One or more software instructions in the modules may be embedded in firmware, such as an EPROM. It will be appreciated that modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
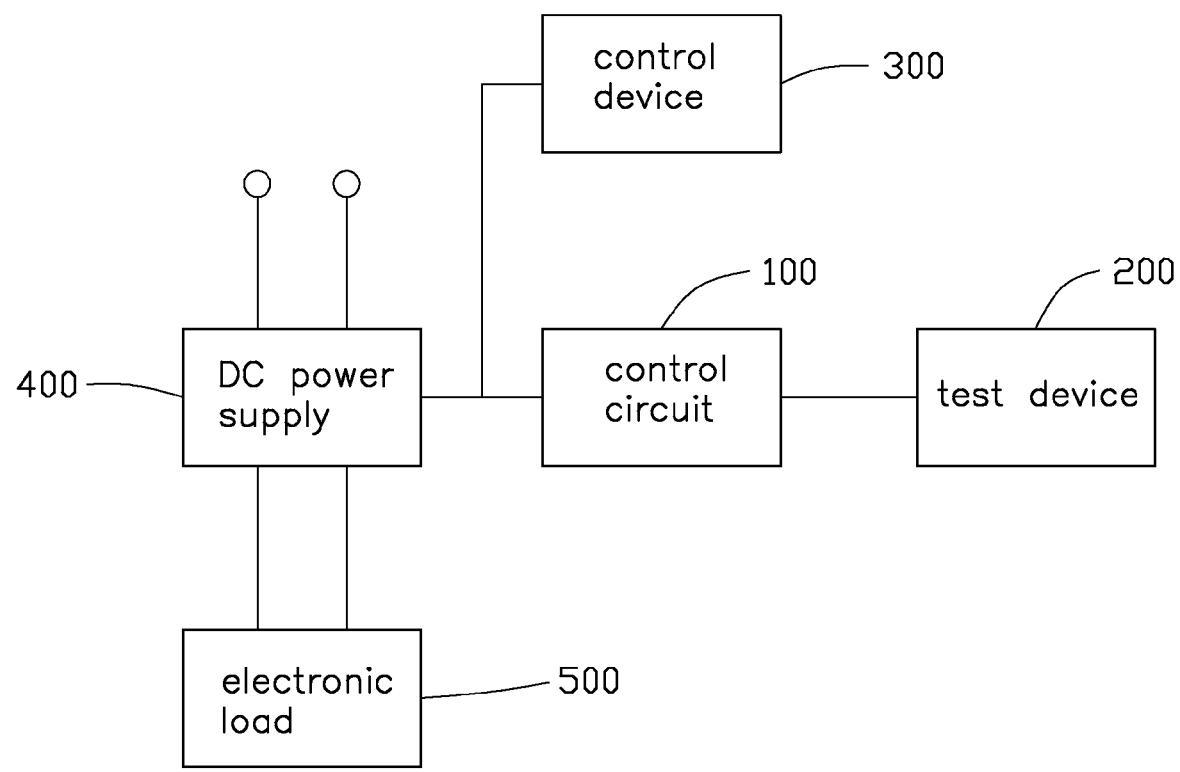
FIG. 1 is a block view of an embodiment of a system for testing power supply performance.
Figure 2:
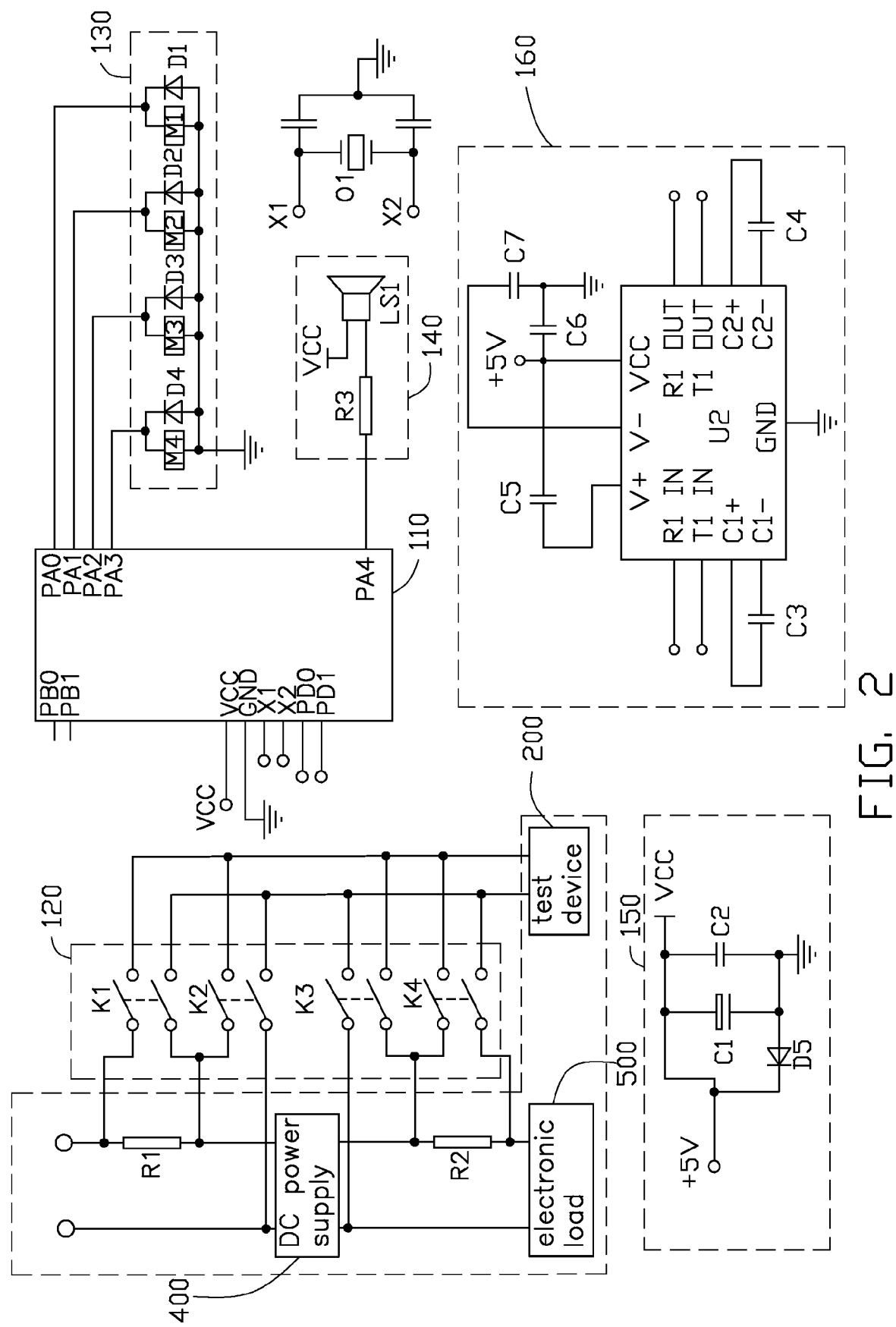
FIG. 2 is a circuit view of the system of FIG. 1.

Referring to FIGS. 1 and 2, a system in an embodiment for testing power supply performance includes a control circuit 100, a test device 200, a control device 300, and a DC power supply 400. The control circuit 100 includes a micro controller 110, a switch module 120, a switch control module 130, an indication module 140, a power module 150, and a conversion module 160. A DC power supply 400 input terminal and a DC power supply 400 output terminal are electrically connected to the test device 200 via the switch module 120. The micro controller 110 outputs the corresponding control signals to the switch control module 130. The switch control module 130 controls the switch module 120 to electrically connect the DC power supply 400 input and output terminals to the test device 200 according to the control signals. The test device 200 reads voltages at the DC power supply 400 input and output terminals which are transmitted to the control device 300. The DC power supply 400 input terminal receives a DC voltage via a resistor R1. The DC power supply 400 output terminal is electrically connected to an electronic load 500 via a resistor R2.

Referring to FIG. 2, the micro controller 110 includes eight bit bidirectional I/O ports PA0~PA4, PB0, PB1, PD0, PD1, clock ports X1 and X2, power port VCC, and ground port GND. The I/O ports PA0~PA4 are control signal output ports. The I/O ports PD0 and PD1 are digital signal receiving and transmission ports. The I/O ports PB0 and PB1 are electrically connected to the test device 200. The micro controller 110 transmits a test signal to the test device 200 via the I/O port PB0 to start test. The test device 200 transmits a feedback signal to the micro controller 110 via the I/O port PB1 when the test is complete. The clock port X1 is electrically connected to the clock port X2 via a crystal oscillator O1. The power port VCC receives a working voltage from the power module 150.

The switch module 120 includes electronic switches K1~K4. Each of the electronic switches K1~K4 includes a first switch and a second switch. The test device 200 can be connected in parallel with the resistor R1 by closing of the first and second switches of the electronic switch K1. The test device 200 can be connected in parallel with a DC power supply 400 input terminal by the closing of the electronic switch K2 first and second switches. The test device 200 can be connected in parallel with the resistor R2 by the closing of the electronic switch K4 first and second switches. The test device 200 can be connected in parallel with a DC power supply 400 output terminal by the closing of the electronic switch K3 first and second switches. The switch control module 130 includes control windings M1~M4 and diodes D1~D4. The I/O ports PA0~PA4 are grounded via the control windings M1~M4 respectively. The I/O ports PA0~PA4 are electrically connected to the diodes D1~D4 cathodes. The diodes D1~D4 anodes are grounded.

The indication module 140 includes a buzzer LS1 and a resistor R3. A buzzer LS1 first terminal receives the working voltage VCC from the power module 150. A buzzer LS1 second terminal is electrically connected to the I/O port PA4 via the resistor R3. The micro controller 110 outputs an indication signal to the indication module 140 when the micro controller 110 receives the feedback signal. The indication module 140 buzzes when it receives the indication signal.

The power module 150 includes a diode D5 and capacitors C1, C2. The capacitors C1, C2 first terminals are electrically connected to a +5V power adapter anode (not shown). The capacitors C1, C2 second terminals are grounded. The capacitors C1, C2 second terminals are electrically connected to a diode D5 anode. A diode D5 cathode is electrically connected to a +5V power adapter cathode. The capacitors C1, C2 first terminals outputs a +5V DC voltage VCC and provides the working voltage to the micro controller 110, the buzzer LS1, and the conversion module 160. The diode D5 is used to protect the power module 150 and prevent the capacitors C1, C2 being damaged should the +5V power adapter be mistakenly connected to the circuit.

The conversion module 160 includes a voltage level conversion chip U1 and capacitors C3~C7. In one embodiment, the voltage level conversion chip U1 is a MAX232 type chip for RS-232 standard interface circuit of computer. The voltage level conversion chip U1 includes charge ports C1+, C1−, V+, V−, C2+, C2−, data transforming ports T1 IN, T1 OUT, R1 IN, R1 OUT, a power port VCC, and a ground port GND. The charge ports C1+, C2+ are electrically connected to the charge ports C1−, C2 via the capacitors C3, C4 respectively. The charge ports V+, V− are electrically connected to the 5V DC voltage and ground via the capacitors C5, C7 respectively. The charge ports C1+, C1−, V+, V−, C2+, C2− and capacitors C5, C6, C7, C9 forms a charge pump circuit for generating a +12V voltage and a −12V voltage which are provided to the RS-232 standard interface circuit. The power port VCC is electrically connected to the +5V DC voltage, and grounded via the capacitor C6.

The data transforming port R1 IN acts as a voltage level signal receiving terminal for receiving the control signals from the control device 300. The data transforming port R1 OUT acts as a voltage level signal transmitting terminal for transmitting the converted control signals to the I/O port PD0. The micro controller 110 switches output ports of the DC power supply 400 for testing according to the received control signals. The data transforming port T1 IN acts as a voltage level signal receiving terminal for receiving the feedback signal from the I/O port PD1. The data transforming port T1 OUT acts as a voltage level signal transmitting terminal for transmitting the converted feedback signals to the control device 300.

During a test, the DC power supply 400 is electrically connected to the test system as shown in FIG. 1. The control device 300 switches the DC power supply 400 output ports for testing by the micro controller 110. The control windings M1~M4 receives the control signals from the micro controller 110, and are powered up according to the received control signals. The electronic switches K1~K4 are closed when the corresponding control windings M1~M4 are powered up. The DC power supply 400 corresponding input and output terminals are electrically connected to the test device 200. The test device 200 reads voltages at the DC power supply 400 corresponding input and output terminals which are transmitted to the control device 300. The test device 200 transmits a feedback signal to the micro controller 110 when the test is complete. The micro controller 110 converts the feedback signal to a voltage level signal which is identified by the control device 300 via the conversion module 160. The test device 200 reads voltages at the resistor R1 and the DC power supply 400 input terminal via the electronic switches K1 and K2 respectively.

The control device 300 calculates a current passing through the resistor R1 according to the voltage at the resistor R1 and a resistor R1 resistance. The test device 200 reads voltages at the resistor R2 and the DC power supply 400 output terminal via the electronic switches K3 and K4 respectively. The control device 300 calculates a current passing through the resistor R2 according to the voltage at the resistor R2 and a resistor R2 resistance. The currents passing through the resistors R1 and R2 are currents at the DC power supply 400 input and output terminals respectively. The control device 300 calculates the DC power supply 400 input and output power according to the voltages and currents at the DC power supply 400 input and output terminals. Then a DC power supply 400 conversion efficiency is calculated according to the DC power supply 400 input and output power ratio.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A system for testing a DC power supply performance, comprising:
   a control circuit electrically capable of being connected to the DC power supply, comprising:
      a micro controller capable of outputting control signals;
      a switch control module capable of receiving the control signals and being powered up according to the control signals;
      a switch module electrically connected to a DC power supply input terminal and a DC power supply output terminal respectively; wherein the switch module is controlled by the switch control module;
   a test device electrically connected to the switch module; wherein the test device is capable of being electrically connected with the DC power supply input and output terminals according to the control signals; and the test device is capable of reading voltages at the DC power supply input and output terminals; and
   a control device electrically connected to the test device; wherein the control device is capable of receiving the voltages at the DC power supply input and output terminals read by the test device.

2. The system of claim 1, wherein the control circuit further comprises a conversion module; the micro controller is electrically connected to the control device via the conversion module; and the control device controls the micro controller to power up the switch control module via the conversion module.

3. The system of claim 2, wherein the control circuit further comprises an indication module; the test device is capable of transmitting a feedback signal to the micro controller when a test is complete; and the indication module is capable of indicating when receives the feedback signal.

4. The system of claim 3, wherein the control circuit further comprises a power module capable of providing working voltages to the micro controller, the indication module, and the conversion module.

5. The system of claim 1, wherein the micro controller comprises a plurality of control signal output ports capable of outputting the control signals; the switch control module comprises a plurality of control windings capable of receiving the control signals; and the plurality of control windings are capable of being powered up according to the control signals.

6. The system of claim 5, wherein the switch module comprises a plurality of electronic switches; and the plurality of control windings are capable of closing the corresponding electronic switches when powered up.

7. The system of claim 6, further comprising an electronic load, a first resistor and a second resistor; the DC power supply input terminal is capable of receiving a DC voltage via the first resistor; and the DC power supply output terminal is electrically connected to the electronic load via the second resistor.

8. The system of claim 7, wherein each electronic switch comprises a first switch and a second switch; the test device is connected in parallel with the first resistor and the DC power supply input terminal via the corresponding first and second switches respectively; and the test device is connected in parallel with the second resistor and the DC power supply output terminal via the corresponding first and second switches respectively.

9. A system for testing a DC power supply performance, comprising:
   a micro controller capable of outputting control signals;
   a switch control module capable of receiving the control signals and being powered up according to the control signals;
   a switch module electrically connected to a DC power supply input terminal and a DC power supply output terminal respectively; wherein the switch module is controlled by the switch control module; and
   a test device electrically connected to the switch module; wherein the test device is capable of being electrically connected with the DC power supply input and output terminals according to the control signals; and the test device is capable of reading voltages at the DC power supply input and output terminals.

10. The system of claim 9, wherein the micro controller comprises a plurality of control signal output ports that are capable of outputting the control signals; the switch control module comprises a plurality of control windings that are capable of receiving the control signals; and the plurality of control windings are capable of being powered up according to the control signals.

11. The system of claim 10, wherein the switch module comprises a plurality of electronic switches; and the plurality of control windings are capable of closing the corresponding electronic switches when powered up.

12. The system of claim 9, further comprising an electronic load, a first resistor and a second resistor; the DC power supply input terminal is capable of receiving a DC voltage via the first resistor; and the DC power supply output terminal is electrically connected to the electronic load via the second resistor.

13. The system of claim 12, wherein each electronic switch comprises a first switch and a second switch; the test device is connected in parallel with the first resistor and the DC power supply input terminal via the corresponding first and second switches respectively; and the test device is connected in parallel with the second resistor and the DC power supply output terminal via the corresponding first and second switches respectively.

14. A system for testing a DC power supply performance, comprising:
   a control circuit, comprising:
      a micro controller capable of outputting control signals;
      a switch control module capable of receiving the control signals and being powered up according to the control signals;
      a switch module electrically connected to a DC power supply input terminal and a DC power supply output terminal respectively; wherein the switch module is controlled by the switch control module;
   a test device electrically connected to the switch module; wherein the test device is capable of being electrically connected with the DC power supply input and output terminals according to the control signals; and the test device is capable of reading voltages at the DC power supply input and output terminals; and
   a control device electrically connected to the test device; wherein the control device is capable of receiving the voltages at the DC power supply input and output terminals read by the test device.

* * * * *